United States Patent [19]
Ishikawa

[11] Patent Number: 5,386,421
[45] Date of Patent: Jan. 31, 1995

[54] IMAGE MEMORY DIAGNOSTIC SYSTEM

[75] Inventor: Yasuo Ishikawa, Kanagawa, Japan

[73] Assignee: Mitsubishi Denki K.K., Tokyo, Japan

[21] Appl. No.: 213,834

[22] Filed: Mar. 16, 1994

Related U.S. Application Data

[63] Continuation of Ser. No. 801,596, Dec. 5, 1991, abandoned, which is a continuation-in-part of Ser. No. 206,826, Jun. 15, 1988, abandoned.

[30] Foreign Application Priority Data

Jun. 22, 1987 [JP] Japan .................. 62-154852

[51] Int. Cl.$^6$ ............... G11C 29/00; G06F 11/22
[52] U.S. Cl. ............................. 371/21.2
[58] Field of Search ..................... 371/21.2

[56] References Cited

U.S. PATENT DOCUMENTS

| | | | |
|---|---|---|---|
| 4,509,043 | 4/1985 | Mossaides | 340/721 |
| 4,569,049 | 2/1986 | McNamara | 371/25.1 X |
| 4,608,690 | 8/1986 | Judge | 371/21.2 |
| 4,631,699 | 12/1986 | Siwik et al. | 371/71 X |
| 4,775,857 | 10/1988 | Staggs | 371/21.2 X |

OTHER PUBLICATIONS

Strom, S., "Design in Self-Testing Capability for Reliable μC-System Operation", *EDN*, Oct. 28, 1981, pp. 102–108.
Abadir, M. et al., "Functional Testing of Semiconductor Random Access Memories", *Computing Surveys*, vol. 15, No. 3, Sep. 1983, pp. 175–198.
Cook, W., "Internal Diagnostics for Tektronix Graphics Terminals", *1981 IEEE Test Conf.*, pp. 221–225.
Cannon, D. et al., *Understanding Advanced Solid State Electronics*, Howard W. Sams & Co., 1986, pp. 151–161.
Pinkham, R., "Video Memory Technology and Applications", Wescon/84 Conf. Record, Oct.–Nov. 1984, session 29, paper 5, pp. 1–9.
McAdams, H. et al., "A 1-Mbit CMOS Dynamic RAM With Design-For-Test Functions", IEEE J. Solid-State Circuits, vol. SC-21, No. 5, Oct. 1986, pp. 635–641.
Sridhar, T., "A New Parallel Test Approach for Large Memories", IEEE Design & Test, Aug. 1986, pp. 15–22.
IBM Technical Reference, Options & Adapters, vol. 2, p. 2.

*Primary Examiner*—Stephen M. Baker
*Attorney, Agent, or Firm*—Kanesaka & Takeuchi

[57] ABSTRACT

In the conventional image memory diagnosis, diagnosis data is written in the image memory for a comparison between the data read out of the image memory and the diagnosis data. All the address and control signals for the image memory are output by the system. By contrast, according to the invention, the display control signal output by the CRT controller is converted into address and control signals for the image memory, thus not only increasing the process speed but also reducing the system load.

1 Claim, 5 Drawing Sheets

IMAGE MEMORY DIAGNOSTIC SYSTEM

CROSS-REFERENCE TO RELATED APPLICATIONS

This is a continuation application of Ser. No. 801,596 filed Dec. 5, 1991, now abandoned, which is a continuation-in-part application of Ser. No. 206,826 filed on Jun. 15, 1988, now abandoned.

BACKGROUND OF THE INVENTION

The present invention relates to image memory diagnostic systems for diagnosing the operation of an image memory of a display unit for displaying characters and/or graphics.

FIG. 4 shows the organization of a conventional display unit constructed based on the display unit disclosed in *IBM Technical Reference Options and Adapters Volume* 2. This display unit includes a system bus 1, a system data bus 1a connected to the system bus 1, a system address bus 1b connected to the system bus 1, a command bus 1c connected the system bus 1, a CRT controller 2 for generating various control signals to be described later, a CRT address bus 2a for transmitting a CRT address from the CRT controller 2, a memory control line 2b for transmitting a memory control signal from the CRT controller 2, a video control line 2c for transmitting a video control signal from the CRT controller 2, a selector 3 for choosing between the system address bus 1b and the CRT address bus 2a, a memory address bus 3a for transmitting a selected signal, an image memory 4 for storing video data, a memory read data bus 4a for transmitting memory read data from the image memory 4, a parallel/serial converter 5 for converting parallel memory read data into serial data, a video data line 5a for transmitting data from the parallel/serial converter 5, a video control circuit 6 for displaying a picture image at a display device, such as CRT or LCD, and a video signal line 6a for transmitting a video signal to the display device.

In operation, in response to a command input at the command bus 1c, the CRT controller 2 outputs at the memory control line 2b a memory control signal, causing the selector 3 to select a system address at the system address bus 1b and output it at the memory address bus 3a as a memory address. At this address, the image memory 4 writes system data from the system data bus 1a.

In response to a command signal from the command bus 1c, the CRT controller 2 then outputs a CRT address at the CRT address bus 2a, a memory control signal at the memory control line 2b, and a video control signal at the video control line 2c. In response to the memory control signal at the memory control line 2b, the selector 3 selects at this time a CRT address at the CRT address bus 2a and outputs a memory address at the memory address bus 3a. The image memory 4 outputs at the memory read data bus 4a a parallel video data (memory read data) accessed by the above memory address and memory control signals.

The parallel/serial converter 5 then converts the above read data into serial data and feeds it to the video control circuit 6 via the video data line 5a. In response to a video control signal from the video control line 2c and data from the video data line 5a, the video control circuit 6 generates and feeds a video signal to the display device via the video signal line 6a. Thus, the display device displays a picture line corresponding to the video data provided via the system data bus 1a. This operation is repeated over the entire lines of the screen to provide a picture field or frame. This field operation is repeated to provide a continuous motion or still picture on the display.

FIG. 5 shows a sequential relationship among the memory address signal, memory control signal, and memory read data in the conventional display unit. The memory address signal is either a CRT address signal or a system address signal output at the memory address bus 3a by the selector 3 in FIG. 4. The memory control signals include a row address select signal (RAS), a column address select signal (CAS), an output enable signal (OE), and a write enable signal (WE). A symbol *1 represents both output and write enable signals from the system bus 1 which are enabled in response to access to the memory 4. The memory read data is a signal output from the image memory 4 at the memory read data bus 4a. This memory read data is output at the read data bus 4a when the RAS, CAS, and OE signals are low and the WE signal is high, with the CRT address signal provided at the CRT address bus 3a.

In order to diagnose the image memory of the above display unit, it is necessary to repeatedly execute the diagnostic program of a processing system for transmitting a system address to write in the image memory the test data from the processing system or read data from the image memory for comparison between the read data and the test data in the processing system. Consequently, such conventional image memory diagnosis not only takes a considerable amount of time but also puts an additional load on the processing system for fault diagnosis.

SUMMARY OF THE INVENTION

Accordingly, it is an object of the invention to provide an image memory diagnostic system which takes little time for diagnosis of the image memory, thus providing high speed processing.

Another object of the invention is to provide an image memory diagnostic system which is able to reduce the load of a diagnostic and processing system.

According to the invention, diagnosis data is fed to the image memory and diagnosis circuit. The data read out of the image memory is then fed to the diagnosis circuit for a comparison between the read data and the diagnosis data to diagnose a fault. The control and address signals output by the CRT controller at the image memory for image display are converted for use as control and address signals for writing in and/or reading from the image memory.

These and other objects, features, and advantages of the invention will become more apparent upon reading of the following description taken in conjunction with the accompanying drawings.

DESCRIPTION OF THE PREFERRED EMBODIMENT

Figure 1:
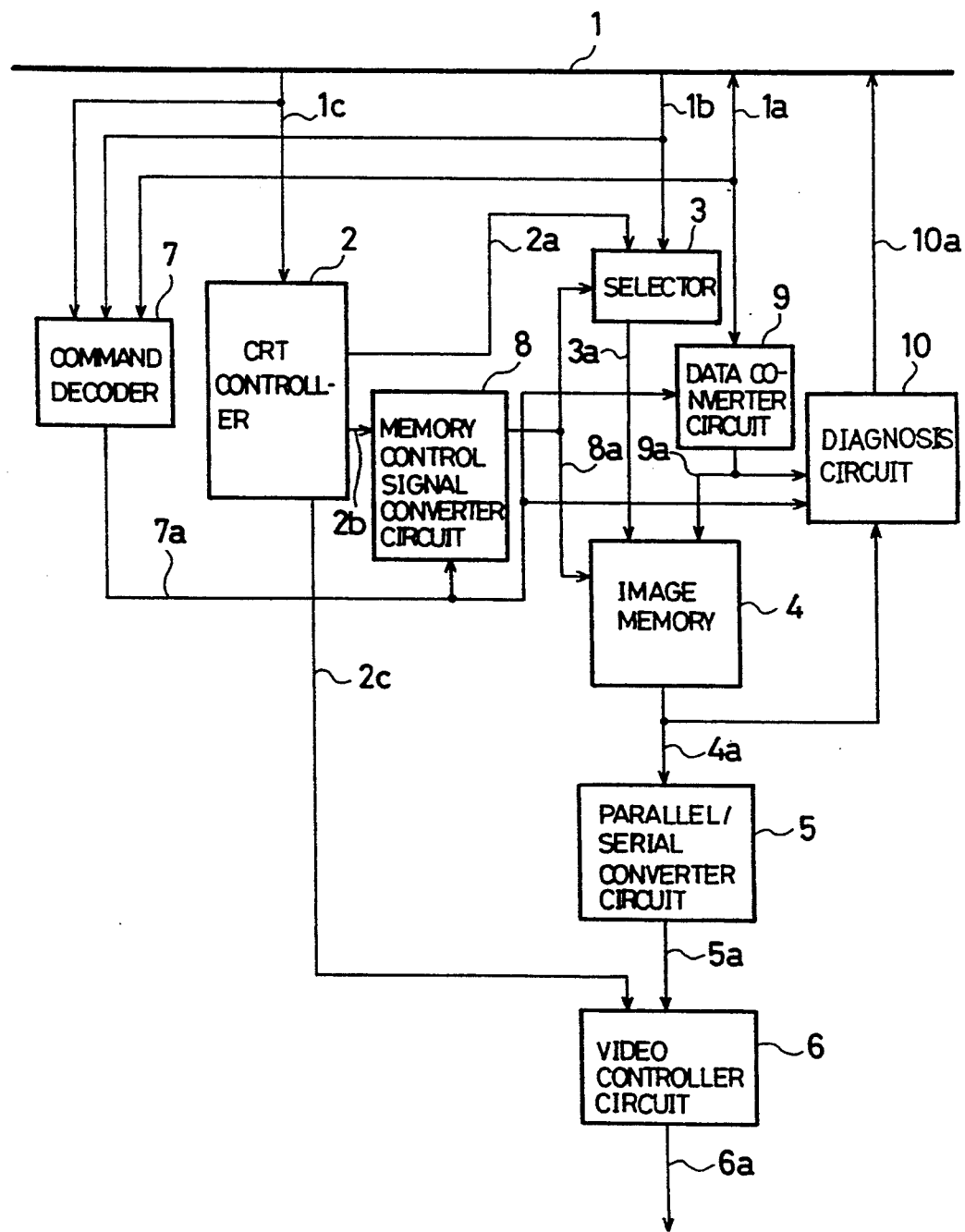
FIG. 1 is a block diagram of a display unit for which an image memory diagnostic system according to the invention is useful.
Figure 4:
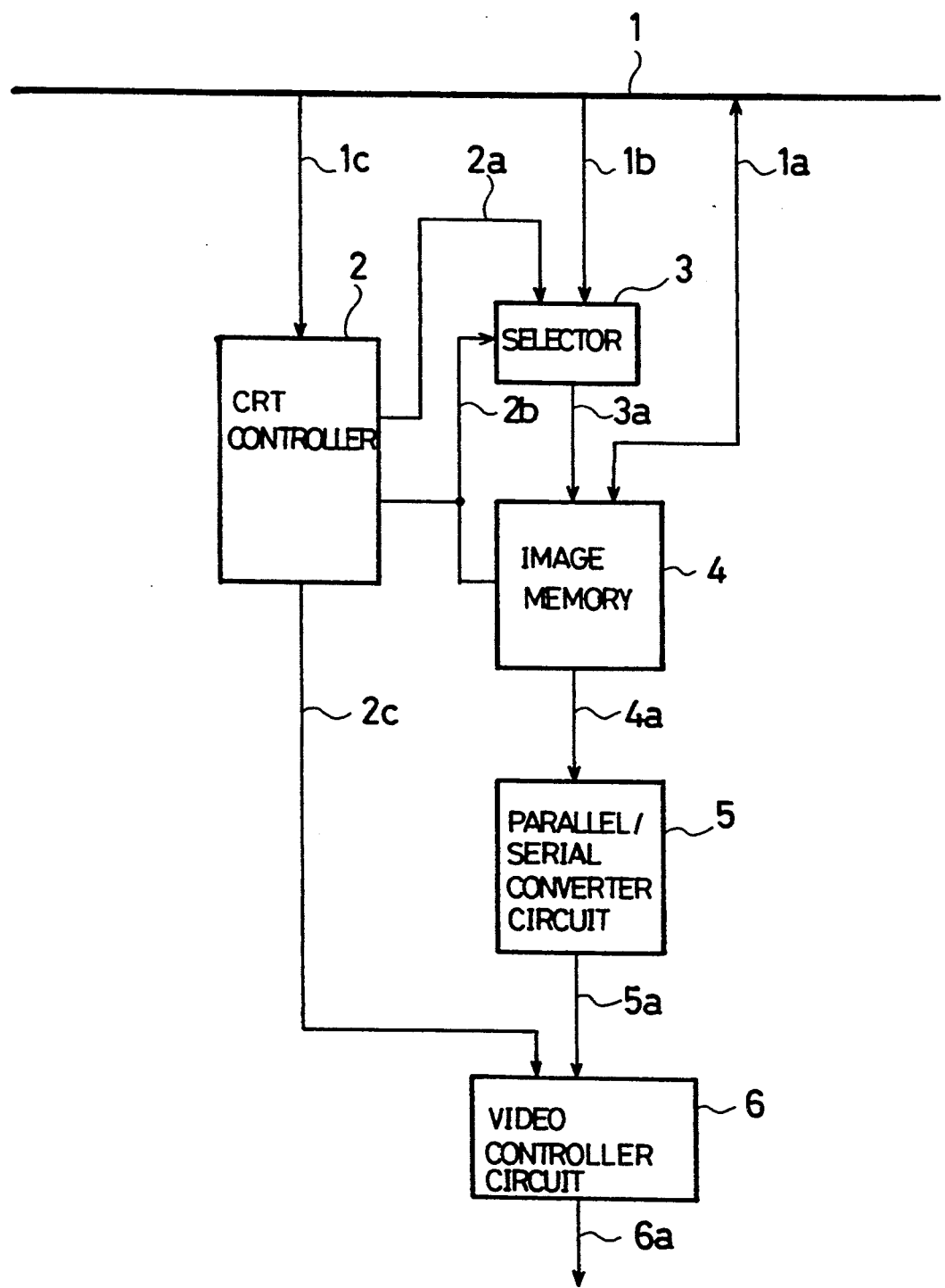
FIG. 4 is a block diagram of a conventional display unit.

In FIG. 1, like reference numerals designate like or corresponding parts of FIG. 4, and their description will be omitted. A command decoder 7 decodes a diagnostic command transmitted by the processing system via a system bus 1 for diagnosing the system and outputs a diagnosis control signal at a diagnosis control line 7a. A memory control signal converter 8 receives a memory control signal from the CRT controller 2 via a memory control line 2b and converts it in response to the diagnosis control signal to output a converted memory control signal (write or read timing signal) at a converted memory control line 8a. A data converter 9 converts system data from a system data bus 1a to form memory write data and feeds it to an image memory 4 via a memory write data bus 9a. A diagnosis circuit 10 compares the memory read data from the memory read data bus 4a and the memory write data from the memory write data bus 9a. If these data are not in agreement, the diagnosis circuit 10 outputs at a decision signal line a decision signal for performing a predetermined fault diagnosis process.

Figure 2:
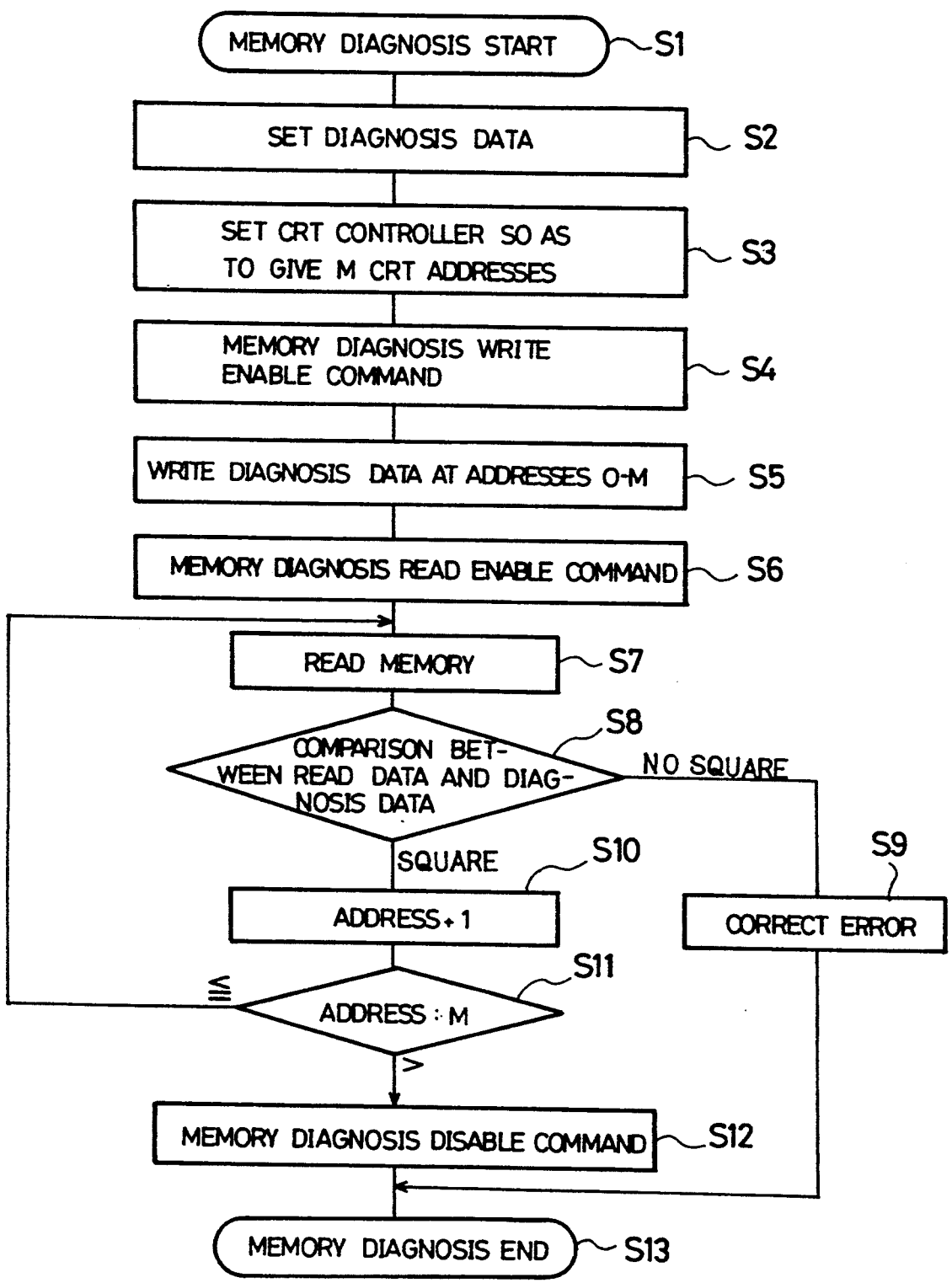
FIG. 2 is a flowchart showing the operation of an image memory diagnostic system according to the invention.

The operation of this image memory diagnosis system will be described with reference to FIG. 2. In the step S1, the diagnosis process of the image memory 4 starts, and the processing system outputs a diagnosis command and diagnosis data at the system bus 1 so that the command decoder 7 decodes the diagnosis command and outputs a diagnosis control signal at the diagnosis control line 7a.

In the step S2, the diagnosis data is set in the data converter 9 via the system data bus 1a. This diagnosis data set via the system data bus 1a may be any data. Whether the data converter 9 is output enabled or disabled is controlled by a diagnosis control signal from the command decoder 7 which is able to recognize a command from the system bus 1. At this point, the data converter 9 remains in the initial state, or output disabled.

In the step S3, the CRT controller 2 is set so as to have M CRT addresses 0, 1, 2, ..., n, ..., M (for display on the screen) output at the CRT address bus 2a. These CRT addresses are converted into memory addresses in the selector 3. Since the CRT addresses and the memory addresses of the image memory 4 are corresponding to each other, it is possible to access the entire memory 4 with the CRT addresses. The values set in the CRT controller 2 so as to have the maximum M addresses are dependent on the memory capacity attached.

In the step S4, a memory diagnosis write enable command is then output at the system bus 1 by the processing system. This enable command is decoded by the command decoder 7 and output as a diagnosis control signal at the diagnosis control line 7a. This diagnosis control signal is fed to both the memory control signal converter 8 and the data converter 9. In response to the diagnosis control signal, the memory control signal converter 8 converts a write enable signal (WE) among the memory control signals and outputs a converted memory control signal (write timing signal) at the converted memory control line 8a. The data converter 9 is output enabled by the diagnosis control signal and outputs at the memory write data bus 9a the diagnosis data (set in the above step S2 and) input via the system data bus 1a as memory write data.

In the step S5, since the CRT addresses are used as memory addresses, in other words, the memory addresses output at the memory address bus 3a by the selector 3 correspond to the CRT addresses at the CRT address bus 2a selected by the converted memory control signal at the converted memory control signal line 8a, the diagnosis data may be written in the entire memory region of the image memory 4 by accessing all the addresses 0 through M.

In the step S6, the processing system then outputs a memory diagnosis read enable command at the system bus 1. This read enable command is decoded by the command decoder 7 and fed to the memory control signal converter 8, the data converter 9, and the diagnosis circuit 10 as a diagnosis control signal via the diagnosis control line 7a. The memory control signal converter 8 reconverts the WE signal among the memory control signals from the CRT controller 2: namely, converts into a converted memory control signal (read timing signal) having read timing for reading the image memory 4 and outputs this converted memory control signal at the converted memory control line 8a. At this point, the data converter 9 is disabled by the diagnosis control signal to output any memory write data at the memory write data bus 9a.

In the step S7, the data of the image memory 4 are read by the converted memory control signal at the converted memory control signal line 8a and the memory address (corresponding to the CRT address) at the memory address bus 3a.

In the step S8, since the diagnosis circuit 10 has been diagnosis enabled by the diagnosis control signal in the step S6, the diagnosis circuit 10 compares the memory read data (signal at the memory read data bus 4a) read in the step S7 and the diagnosis data (signal stored via the memory write data bus 9a during the output enable period of the data converter 9 and corresponding to the memory read data to be compared). If these data are not in agreement, a decision signal indicative of a fault of the image memory 4 is outputs at the decision signal line 10a to the system bus 1 in the step S9. This causes the processing system to perform a predetermined error correction process.

If an agreement between the memory read data and the diagnosis data is found in the step S8, the memory address is incremented by 1 in the step S10. If the value of this incremented address is found less than the maximum value M in the step S11, the process goes back to the step S7 to repeat the above cycle. If the address value is found greater than the value M, the process goes to the step S12, where the processing system issues a memory diagnosis disabled command to disable the diagnosis circuit 10 to diagnose. In the step S13, the memory diagnosis process ends.

As has been described above, comparisons are made in the step S8 for all the addresses (up to the maximum CRT address M) of the image memory 4. If all the results are the same, the memory fault diagnosis finds no abnormality. As a result, the processing system sends to the memory control signal converter 8 a signal for enabling a memory control signal from the CRT controller 2 and to the data converter 9 a signal for enabling a signal of the system data bus 1a. With this process, it is possible to decrease the number of steps for memory fault diagnosis. The use of CRT addresses as memory addresses also shortens the diagnosis time.

Figure 3:
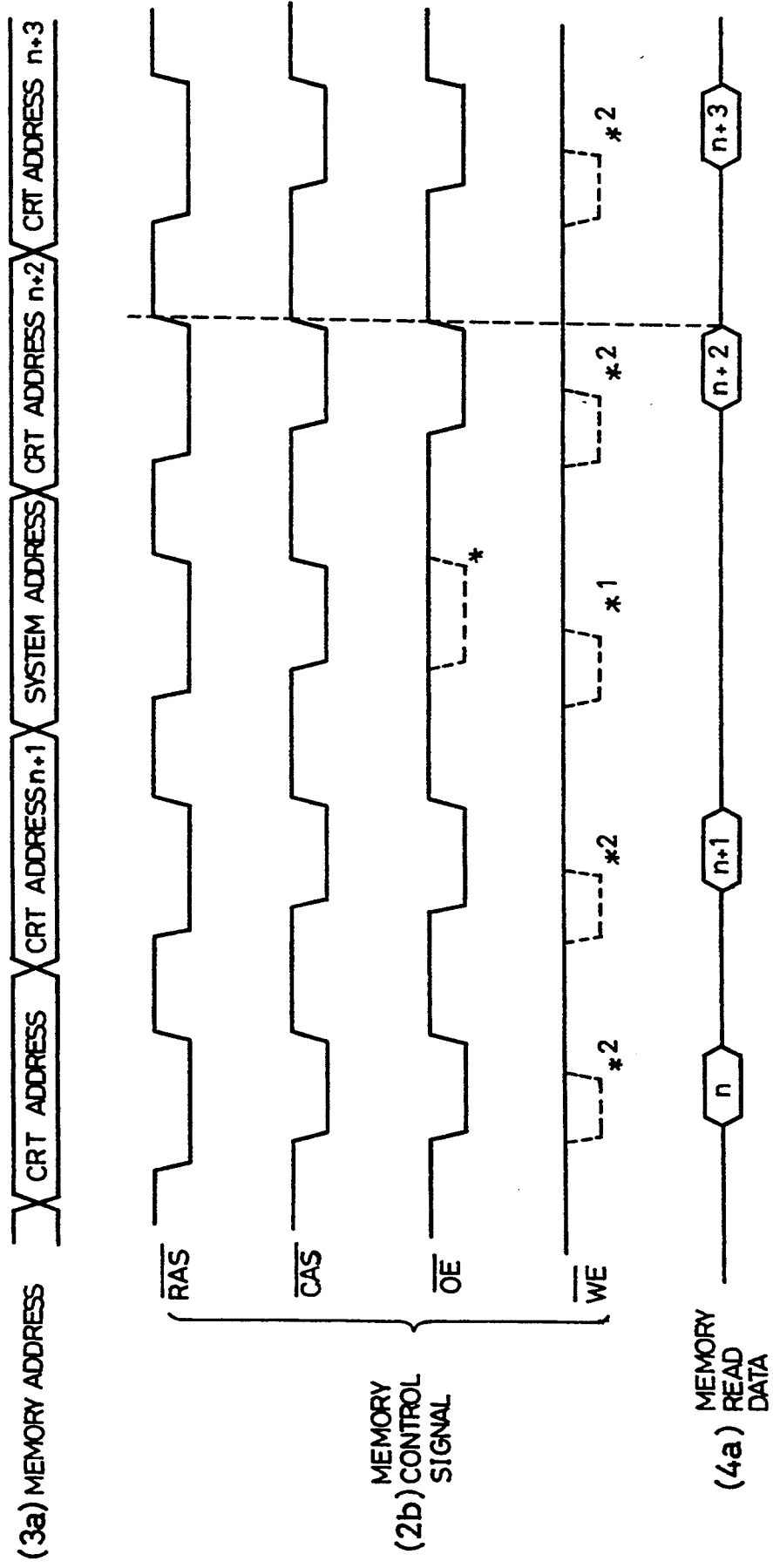
FIG. 3 is a timing chart showing a sequential relationship among the memory address signal, memory control signal, and memory read data in the above image memory diagnostic system.
Figure 5:
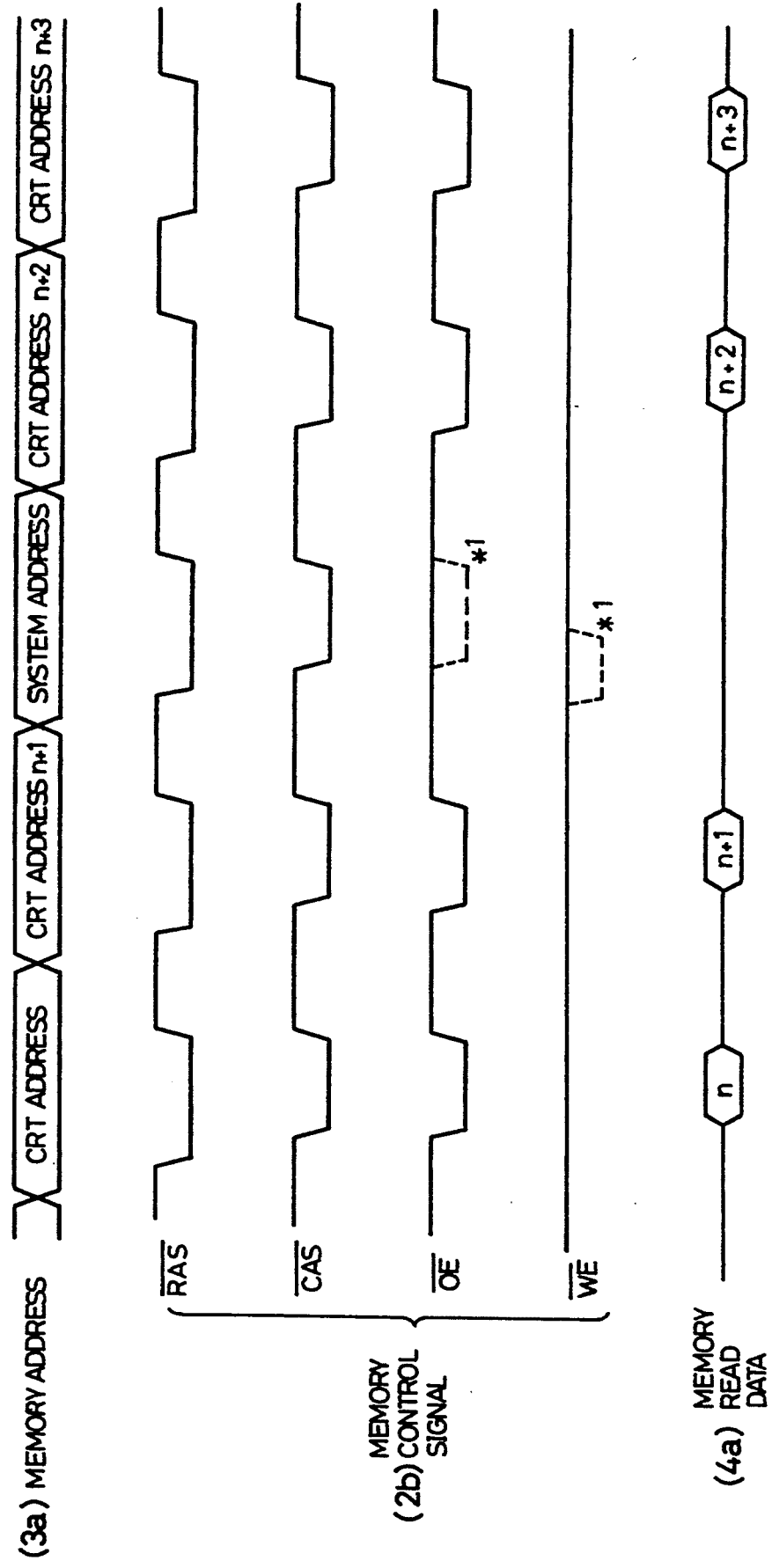
FIG. 5 is a timing chart showing a sequential relationship among the memory address signal, memory control signal and memory read data in the above conventional display unit.

In FIG. 3, like reference numerals designate like or corresponding parts of FIG. 5, and their description will be omitted. A symbol *2 represents a signal which is enabled by the memory diagnosis write enable signal (command of the step S4) and disabled by the memory diagnosis read enable signal (command of the step S6); namely, a write enable signal (write timing signal) necessary for writing data in the image memory 4. This write enable signal enables the image memory 4 to write input data at the CRT address.

The method will be described in more detail step by step with reference to FIG. 6.

In Step 20, the CPU writes a predetermined diagnosis data, such as all ones [1 1 1 ... 1], into the data converter 9 from the system bus 1.

In Step 21, the CPU permits the selector 3 to select an address bus 2a from the CRT controller 2 and connect it to a memory address bus 3a of the image memory 4.

In Step 22, the CRT controller 2 designates an address "0" in the image memory 4.

In Step 23, the diagnosis data [1 1 1 ... 1] stored in the data converter is written into the image memory 4 at the address "0".

In Step 24, the CRT controller 2 increments the address by "+1".

In Step 25, if the address "+1" is not greater than the maximum address M of the image memory 4 (address "+1"=M), the diagnosis data [1 1 1 ... 1] is written into all of the addresses of the image memory 4 as in Step 23.

In Step 26, the CRT controller 2 changes the designated address to "0".

In Step 27, the written data is read out of the image memory 4 from the address "0".

In Step 28, the readout data is compared with the diagnosis data [1 1 1 ... 1] of the data converter 9 in the diagnosis circuit 10.

In Step 29, if these data are in agreement, the CRT controller 2 increments the address by "+1".

In Step 30, if the address "+1" is not greater than the maximum address M, data of the image memory 4 is compared with the diagnosis data [1 1 1 ... 1] for all of the addresses as in Step 28. If these data are not in agreement in Step 28, an error correction process is carried out in Step 31. That is, if data read out of the image memory 4 at any of the addresses is not in agreement with the diagnosis data [1 1 1 ... 1], the CPU performs an error correcting operation.

As has been described above, according to the invention, the display addresses may be used as memory addresses in diagnosis to thereby provide a display unit without extensive modification. In addition, even if the memory capacity increases with the increased resolution of display, it is possible not only to shorten the memory diagnostic time but also lower the load on the processing system.

While a preferred embodiment of the invention has been described using specific terms, such description is illustrative purposes only, and it is to be understood that changes and modifications may be made without departing from the spirit and scope of the invention as recited in the following claims.

What is claimed is:

1. A method of diagnosing an image memory for a display unit of a system which includes an image memory and a display controller responsive to a command from said system to generate a display address and write a set of data corresponding to a predetermined number of bits constituting an address area of said image memory set by said system to each address area of said image memory based on said display address and output said written data as a video signal, said method comprising the steps of:

writing said set of data to an area at a specified address of said image memory based on said display address while holding said data as diagnostic data in a data converter;

reading said written data as memory read data;

comparing said memory read data with said diagnostic data from said data converter in a diagnosis circuit; and performing a predetermined error correction process if said memory read data and said diagnostic data are not in agreement.

* * * * *